(12) United States Patent
Chien

(10) Patent No.: US 7,804,158 B2
(45) Date of Patent: Sep. 28, 2010

(54) ELECTRONIC DEVICE WITH SHIELDING STRUCTURE AND METHOD OF MANUFACTURING THE SAME

(75) Inventor: Hwey-Ching Chien, San Diego, CA (US)

(73) Assignee: MaxRise Inc., Hsin-Chu (TW)

( * ) Notice: Subject to any disclaimer, the term of this patent is extended or adjusted under 35 U.S.C. 154(b) by 288 days.

(21) Appl. No.: 12/076,982

(22) Filed: Mar. 26, 2008

(65) Prior Publication Data
US 2009/0243052 A1    Oct. 1, 2009

(51) Int. Cl.
*H01L 23/552* (2006.01)
*H01L 21/38* (2006.01)

(52) U.S. Cl. ............... 257/659; 257/660; 257/E23.114; 438/620; 438/621; 438/622

(58) Field of Classification Search ................. 257/142, 257/148, 174, 194, 285, 322, 369, 371–375, 257/607–612, 659, 914–925, E21.135–E21.153, 257/660; 438/109, 121, 620–624, 731
See application file for complete search history.

(56) References Cited

U.S. PATENT DOCUMENTS

2007/0262422 A1*  11/2007  Bakalski et al. ............. 257/659

* cited by examiner

*Primary Examiner*—Jasmine J Clark
(74) *Attorney, Agent, or Firm*—Bacon & Thomas, PLLC

(57) ABSTRACT

An electronic device includes a substrate, an active circuit, and a shielding structure. The active circuit is formed on the substrate. The shielding structure is disposed surrounding the active circuit, and includes a first heavy ion-doped region, first metal stack, second heavy ion-doped region, second metal stack and top metal. The first heavy ion-doped is formed in the substrate and located at a first side of the active circuit. The first metal stack is formed on the first heavy ion-doped region of the substrate, wherein the first metal stack is connected to a ground voltage. The second heavy ion-doped region is formed in the substrate and located at a second side of the active circuit. The second metal stack is formed on the second heavy ion-doped region of the substrate. The top metal is formed on the first metal stack and second metal stack and passing over the active circuit.

21 Claims, 6 Drawing Sheets

US 7,804,158 B2

ELECTRONIC DEVICE WITH SHIELDING STRUCTURE AND METHOD OF MANUFACTURING THE SAME

BACKGROUND OF THE INVENTION

1. Field of the Invention

The invention relates in general to an electronic device and method of manufacturing the same, and more particularly to an electronic device with shielding structure from crosstalk, noise and interferences, and method of manufacturing the same.

2. Description of the Related Art

When two circuits are side-by-side with each other, crosstalk and interference may occur if the operation frequencies of the circuits are high, especially at above RF frequency which is about a few tens of megahertz to several gigahertz or even higher. This kind of problem is especially severe if various kinds of circuits are integrated on the same substrate. For an example, in a typical system on chip (SOC) floor plan, radio frequency circuits such as a low noise amplifier (LNA) may sit next to high-speed logics or a power amplifier. Under such a situation, the performance and linearity of the LNA is usually degraded by crosstalk or interferences from the high-speed logic circuits or the power amplifier.

FIG. 1 is a schematic diagram of possible leakage paths of the crosstalk and interferences in a conventional radio frequency integrated circuit (RFIC). A RFIC 100 includes a silicone substrate 102, an active circuit 104 such as a LNA, and noisy sources 106, such as high speed logics or power amplifiers. The active circuit 104 and noisy sources 106 are disposed on the silicone substrate 102 and located adjacent to each other. Conventionally, crosstalk or interferences between the active circuit 104 and noisy sources 106 may be occurred both through the air or the silicone substrate 102 as shown in FIG. 1.

In case that the noisy sources 106 are high speed logics, the fast rise and fall time of their high-speed logic signals may contain many harmonics. If the high speed clock is a few tens or a few hundred megahertz, its fundamental frequency signal or harmonics may fall into the RF signal bands of the active circuit 104, and the small RF signal of the active circuit 104 will then be inevitably contaminated by these harmonics.

In case that the noisy sources 106 are power amplifiers, they usually generate RF signals with much larger power than that of the signal received by the active circuit 104. Once these large signals leak to the input of the active circuit 104, they may compress the active circuit 104, degrade its linearity, and cause more inter-modulations.

As a result, the crosstalk or interferences may degrade the signal integrity and circuit performance, and the performance degradation is especially severe in a SOC device in which various kinds of circuitries (RFIC, high-speed logic and analog circuits etc) are integrated on a single substrate.

SUMMARY OF THE INVENTION

The invention is directed to an electronic device with shielding structure and method of manufacturing the same. Through the shielding structure formed on the substrate and located surrounding the active circuit, the active circuit can be effectively shielded from crosstalk, noise and interferences.

According to a first aspect of the present invention, an electronic device is provided. The electronic device comprises a substrate, an active circuit, and a shielding structure. The active circuit is formed on the substrate. The shielding structure is disposed surrounding the active circuit for shielding the active circuit from crosstalk, noise and interferences. The shielding structure comprises a first heavy ion-doped region, a first metal stack, a second heavy ion-doped region, a second metal stack and a top metal. The first heavy ion-doped is formed in the substrate and located at a first side of the active circuit. The first metal stack is formed on the first heavy ion-doped region of the substrate, wherein the first metal stack is connected to a ground voltage. The second heavy ion-doped region is formed in the substrate and located at a second side of the active circuit. The second metal stack is formed on the second heavy ion-doped region of the substrate. The top metal is formed on the first metal stack and the second metal stack and passing over the active circuit.

According to a second aspect of the present invention, a method of manufacturing an electronic device is provided. The method comprises providing a substrate comprising a region for forming the active circuit; forming a first heavy ion-doped region and a second heavy ion-doped region in the substrate and respectively at a first side and a second side of the region for forming the active circuit; forming a first metal stack and a second metal stack together with the active circuit respectively on the first heavy ion-doped region, the second heavy ion-doped region, and the region for forming the active circuit, wherein the first metal stack is connected to a ground voltage; and forming a top metal on the first metal stack and the second metal stack to pass over the active circuit.

The invention will become apparent from the following detailed description of the preferred but non-limiting embodiments. The following description is made with reference to the accompanying drawings.

DETAILED DESCRIPTION OF THE INVENTION

The invention is directed to an electronic device having a shielding structure for the active circuit in order to resolve the problem of crosstalk, noise or interferences and maintain good signal integrity and circuit performance.

Figure 1:
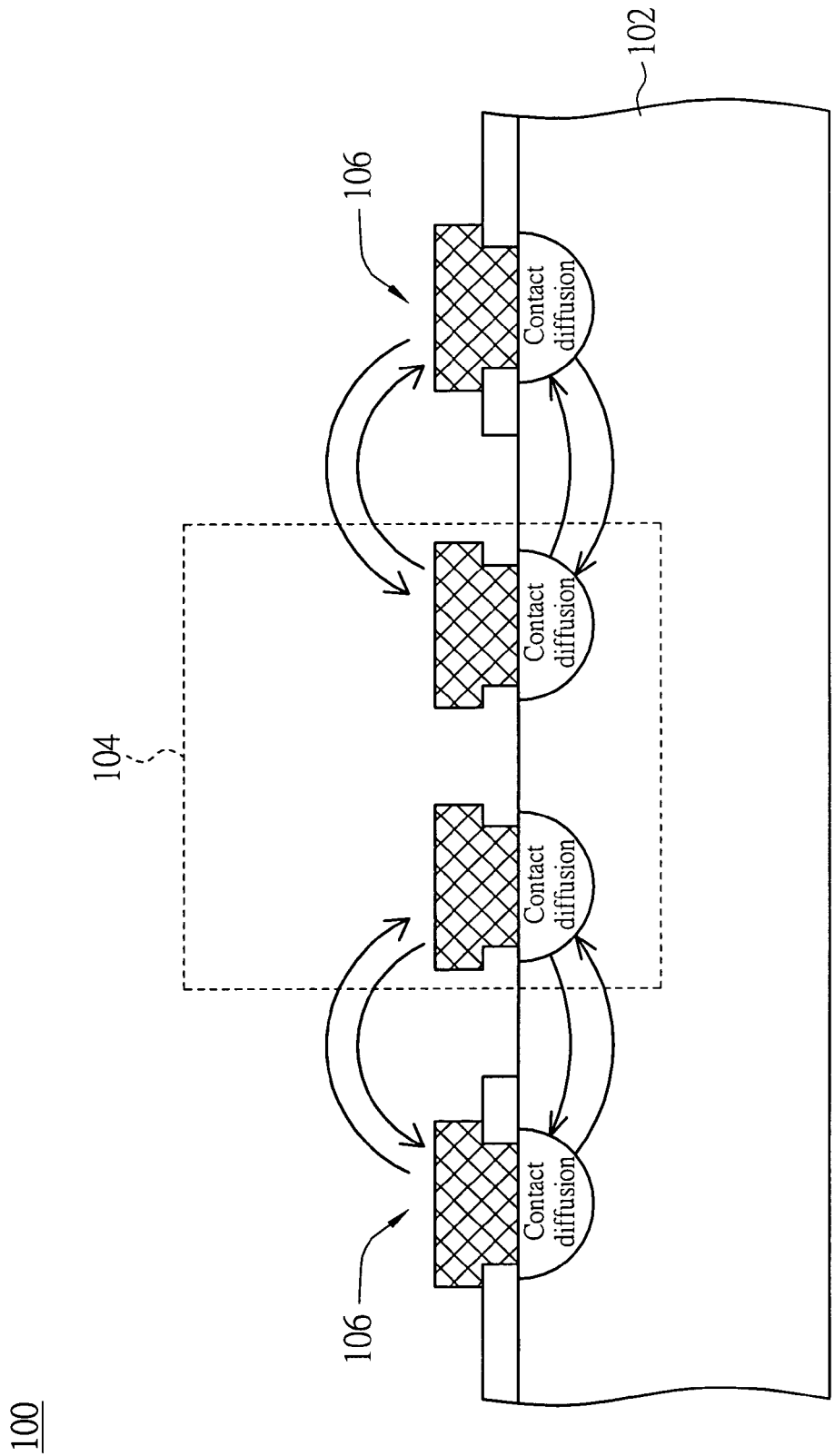
FIG. 1 is a schematic diagram of possible leakage paths of the crosstalk and interferences in a conventional RFIC.
Figure 2:
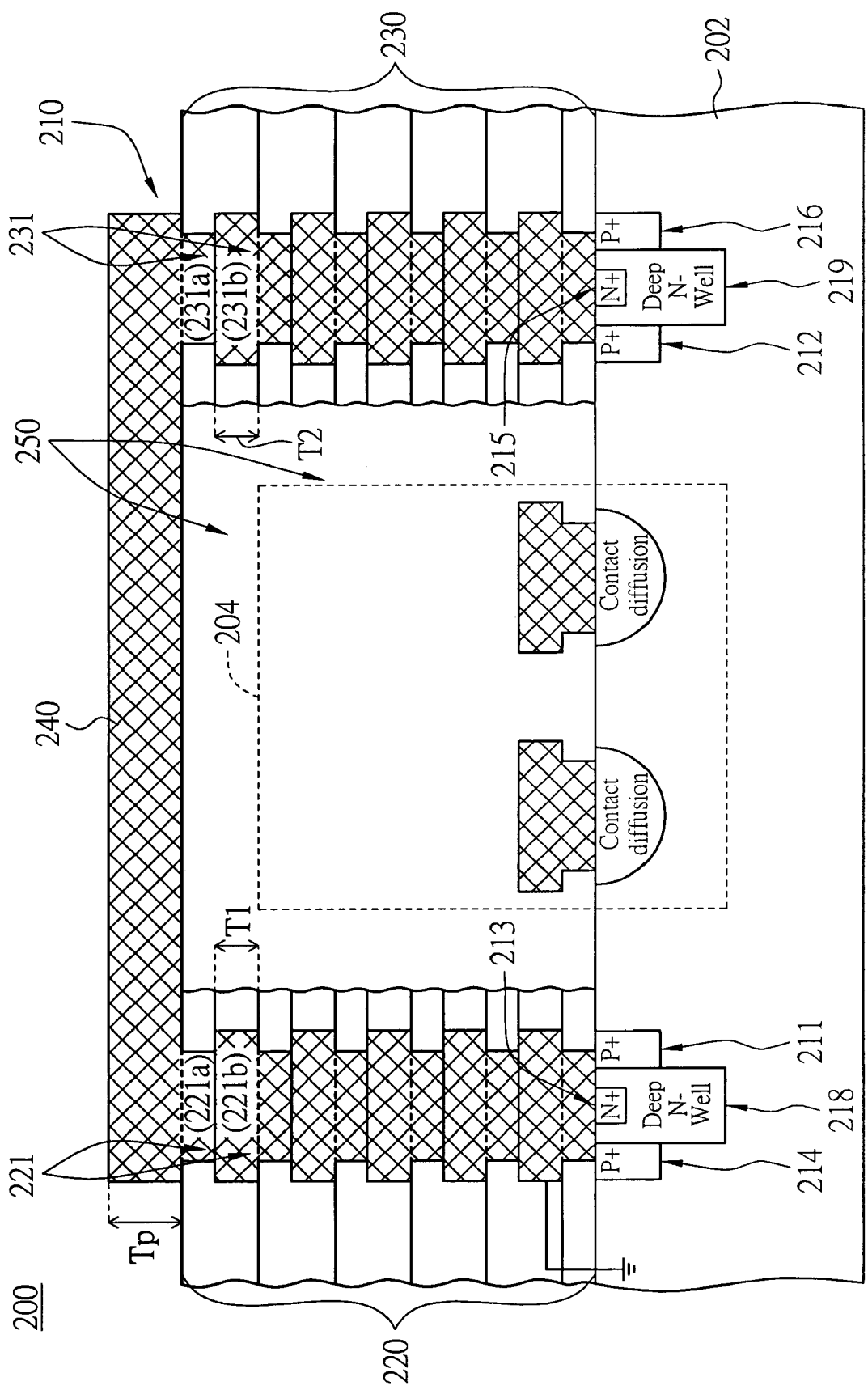
FIG. 2 is a cross-sectional view of an electronic device with a shielding structure according to a preferred embodiment of the invention.

Referring to FIG. 2, a cross-sectional view of an electronic device with a shielding structure according to a preferred embodiment of the invention is shown. An electronic device 200 includes a substrate 202, an active circuit 204 and a shielding structure 210. For example, the electronic device 200 is a RFIC, mixed-signal IC, high-speed digital circuit or SOC IC of a communication system, such as GSM, CDMA, portable digital TV, the third-generation or fourth-generation mobile phone or a personal communication system. The electronic device 200 can be implemented in a complementary metal oxide semiconductor (CMOS), bipolar transistor, BiC- MOS (including both bipolar transistors and MOSFET) or compound semiconductor fabrication process.

In the embodiment, the electronic device 200 is exemplified to be implemented in a CMOS process, and the substrate 202 is a P-type substrate made of silicone. The active circuit 204 is formed on the substrate 202, which can be a noise source such as a clock generator, high-speed bus, high-speed digital circuit, driver or power amplifier, or a critical circuit to be shielded, such as a LNA. The shielding structure 210 is disposed surrounding the active circuit 204 for shielding the active circuit 204 from crosstalk with neighboring circuits, or from noise and interferences generated by noisy sources in the surroundings.

As shown in FIG. 2, the shielding structure 210 includes first, second, third, fourth, fifth and sixth heavy ion-doped regions 211, 212, 213, 214, 215 and 216, first and second deep ion-doped regions 218 and 219, a first metal stack 220, a second metal stack 230 and a top metal 240.

The first heavy ion-doped region 211 is formed in the substrate 202 and located at a first side, such as the left side, of the active circuit 202. The first deep ion-doped region 218 is formed in the substrate 202 and located adjacent to the first heavy ion-doped region 211. The first deep ion-doped region 218 includes a third heavy ion-doped region 213 and has an ion-doping polarity opposite to that of the first heavy ion-doped region 211 and the same as that of the third heavy ion-doped region 213. The fourth heavy ion-doped region 214 is formed in the substrate 202 and located adjacent to adjacent to the first deep ion-doped region 218, and the fourth heavy ion-doped region 214 has an ion-doping polarity the same as that of the first heavy ion-doped region 211. In the embodiment, the first and fourth heavy ion-doped regions 211 and 214 are P+ diffusion regions. The first deep ion-doped region 218 is a deep N− well and the third heavy ion-doped region 213 is an N+ diffusion region.

The second heavy ion-doped region 212 is formed in the substrate 202 and located at a second side, such as the right side, of the active circuit 202. The second deep ion-doped region 212 is formed in the substrate 202 and located adjacent to the second heavy ion-doped region 212. The second deep ion-doped region 219 includes a fifth heavy ion-doped region 215 and has an ion-doping polarity opposite to that of the second heavy ion-doped region 212 and the same as that of the fifth heavy ion-doped region 215. The sixth heavy ion-doped region 216 is formed in the substrate 202 and located adjacent to the second deep ion-doped region 219, and the sixth heavy ion-doped region 216 has an ion-doping polarity the same as that of the second heavy ion-doped region 212. In the embodiment, the second and sixth heavy ion-doped regions 212 and 216 are P+ diffusion regions, the second deep ion-doped region 219 is a deep N− well, and the fifth heavy ion-doped region 215 is an N+ diffusion region.

Moreover, the first metal stack 220 is formed on the first heavy ion-doped region 211, the first deep ion-doped region 218 and the fourth heavy ion-doped region 214 of the substrate 202, and the first metal stack 220 is connected to a ground voltage. The second metal stack 230 is formed on the second heavy ion-doped region 212, the second deep ion-doped region 219 and the sixth heavy ion-doped region 216 of the substrate 202. The top metal 240 is formed on the first metal stack 220 and the second metal stack 230 and passes over the active circuit 204. The first metal stack 220, the second metal stack 230 and the top metal 240 are electrically isolated from the active circuit 204 by dielectric material 250, such as silicone dioxide ($SiO_2$).

As shown in FIG. 2, for example, the active circuit 204 has N semiconductor layers (corresponding to N dielectric layers 250 at each side of the active circuit 204), and the top layer of the active circuit 204 is a dielectric layer. The first metal stack 220 and the second metal stack 230 respectively include N layers of first metal 221 and second metal 231 corresponding to the N semiconductor layers of the active circuit 204, and m layers of first metal 221 and second metal 231 corresponding to m dielectric layers 250 formed on the active circuit 204, wherein N is a natural number and m is an even number.

Besides, as shown in FIG. 2, the (N+m) layers of first metal 221 and the layers of second metal 231 are formed by staggering metal layers 221b (231b) and via metals 221a (231a). Specifically, the layer of first metal 221 or second metal 231 formed corresponding to a dielectric layer of the active circuit 204 is a via (or contact) metal 221a or 231a, while the layer of first metal 221 or the second metal 231 formed corresponding to a metal layer of the active circuit 204 is a metal layer 221b or 231b. The thickness Tp of the top metal 240 is about twice the thickness T1 and T2 of the first metal 221 and the second metal 231.

In the embodiment, N=9 and m=2, however, the invention is not limited thereto. For example, the active circuit 204 can be a conducting line consisted of a single metal layer, then the value N is 1, and the first side and the second side are two opposite sides of the conducting line. The value m can be any other even number, such as 0, i.e. the top metal 240 is directly formed upon the active circuit 204. Practically, a suitable distance between the top metal 240 and the active circuit 204, which is formed by interposing the dielectric layers 250, can help to reduce the parasitic capacitance of the active circuit 204.

Figure 3:
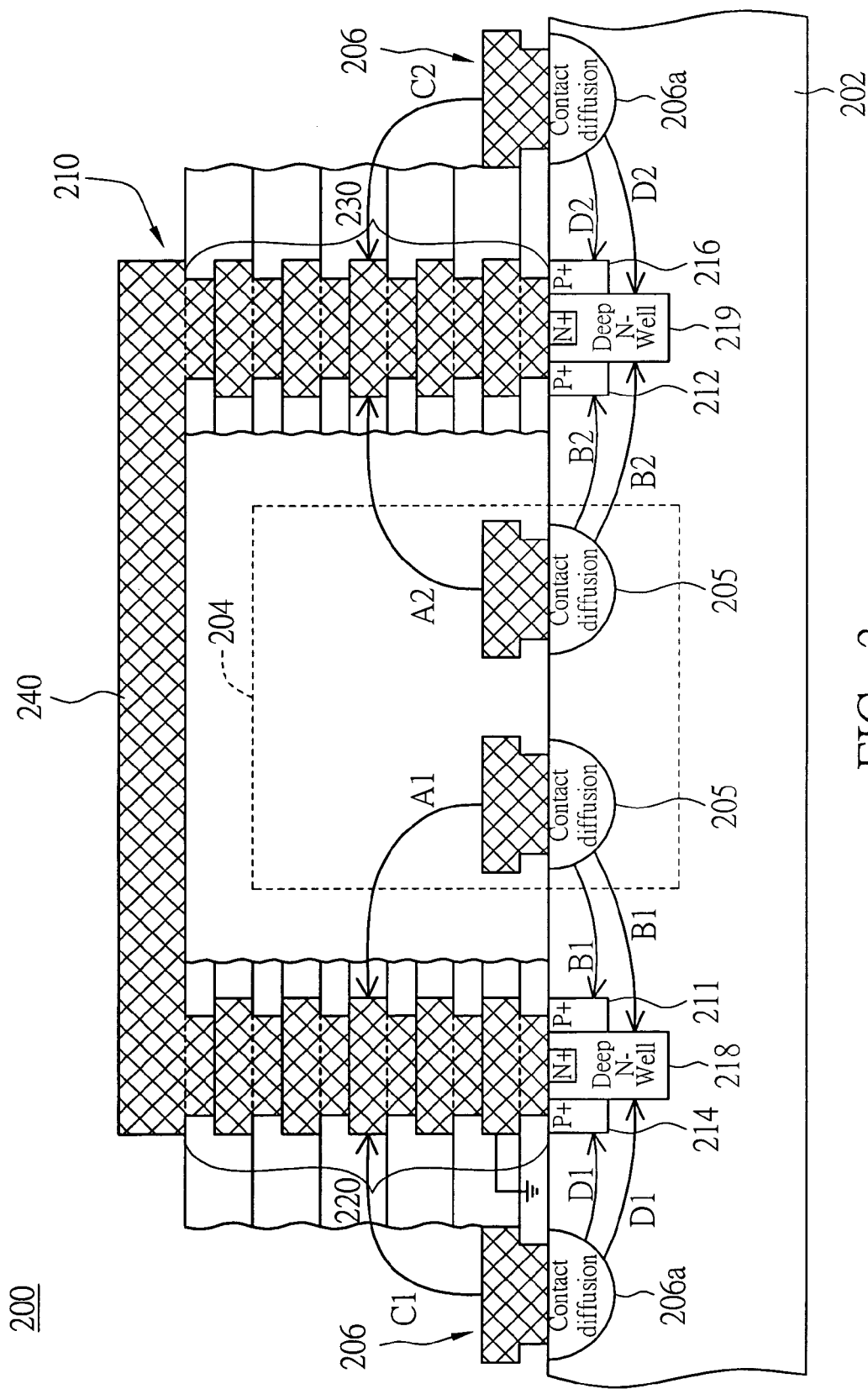
FIG. 3 is a schematic diagram of the shielding structure in FIG. 2 blocking the active circuit from possible paths of crosstalk or interference.

Referring to FIG. 3, a schematic diagram of the shielding structure 210 in FIG. 2 blocking the active circuit 204 from possible paths of crosstalk or interference is shown. Because the whole shielding structure 200 is grounded via the first metal stack 220, the electric fields A1 and A2 generated from the active circuit 204 and passing through the air will be blocked by the first metal stack 220 and the second metal stack 230 respectively, and the electric fields B1 and B2 generated from contact diffusion regions 205 of the active circuit 204 and passing through the substrate 202 will be blocked by the ion-doped regions 211, 218, 214 and 212, 219, 216 respectively from cross-talking or interfering with external circuits 206. Conversely, the electric fields C1 and C2 respectively generated from the neighboring circuits 206 at two sides of the active circuit 204 and passing through the air will also be blocked by the shielding structure 210, and the electric fields D1 and D2 respectively generated from contact diffusion regions 206a of the neighboring circuits 206 and passing through the substrate 202 from cross-talking and interfering with the active circuit 204.

Although the shielding structure 210 is exemplified to shield the active circuit 204 from crosstalk or interference with the neighboring circuits 206 in the embodiment, the shielding structure 210 of the invention can be further used for shielding the active circuit 206 from any noise of devices, say, switches, or even from interference sources located outside the electronic device 200. As long as the shielding structure 210 can be provided in the electronic device 200 for shielding the active circuit 204 from crosstalk, noise or interference, all the alternatives are not depart from the scope of the invention.

It is noted that although the shielding structure 210 is exemplified to have two heavy ion-doped regions 211, 214 and a deep ion-doped region 218 at the left side of the active circuit 204 and two heavy ion-doped regions 212, 216 and a deep ion-doped region 219 at the right side of the active circuit 204 in the embodiment, the shielding structure 210 of the invention can also include only one heavy ion-doped region, such as the (P+) region 211 at one side, such as the left side, of the active circuit 204 and one heavy ion-doped region, such as (P+) region 212 at another side, such as the right side, of the active circuit 204. As long as the shielding structure 210 includes at least one heavy ion-doped region at one side of the active circuit 204 and at least one heavy ion-doped region at another side of the active circuit 204, the electric fields B1 and B2 generated from the active circuit 204 and passing through the substrate 202 can be blocked by the heavy ion-doped regions from reaching the neighboring circuits 206, all the alternatives are not apart from the scope of the invention.

Figure 4:
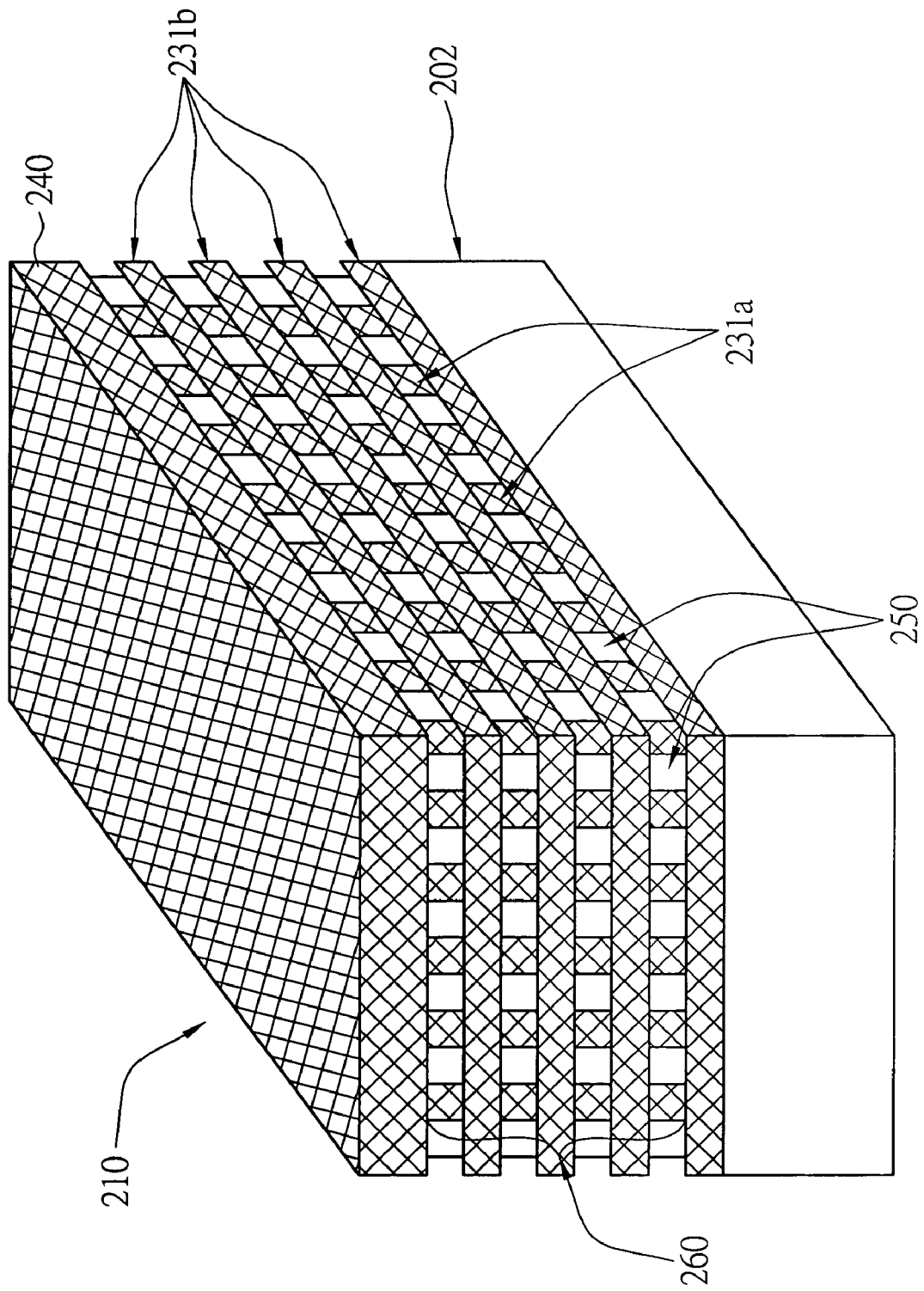
FIG. 4 is a three-dimensional view of the shielding structure in FIG. 2.
Figure 5:
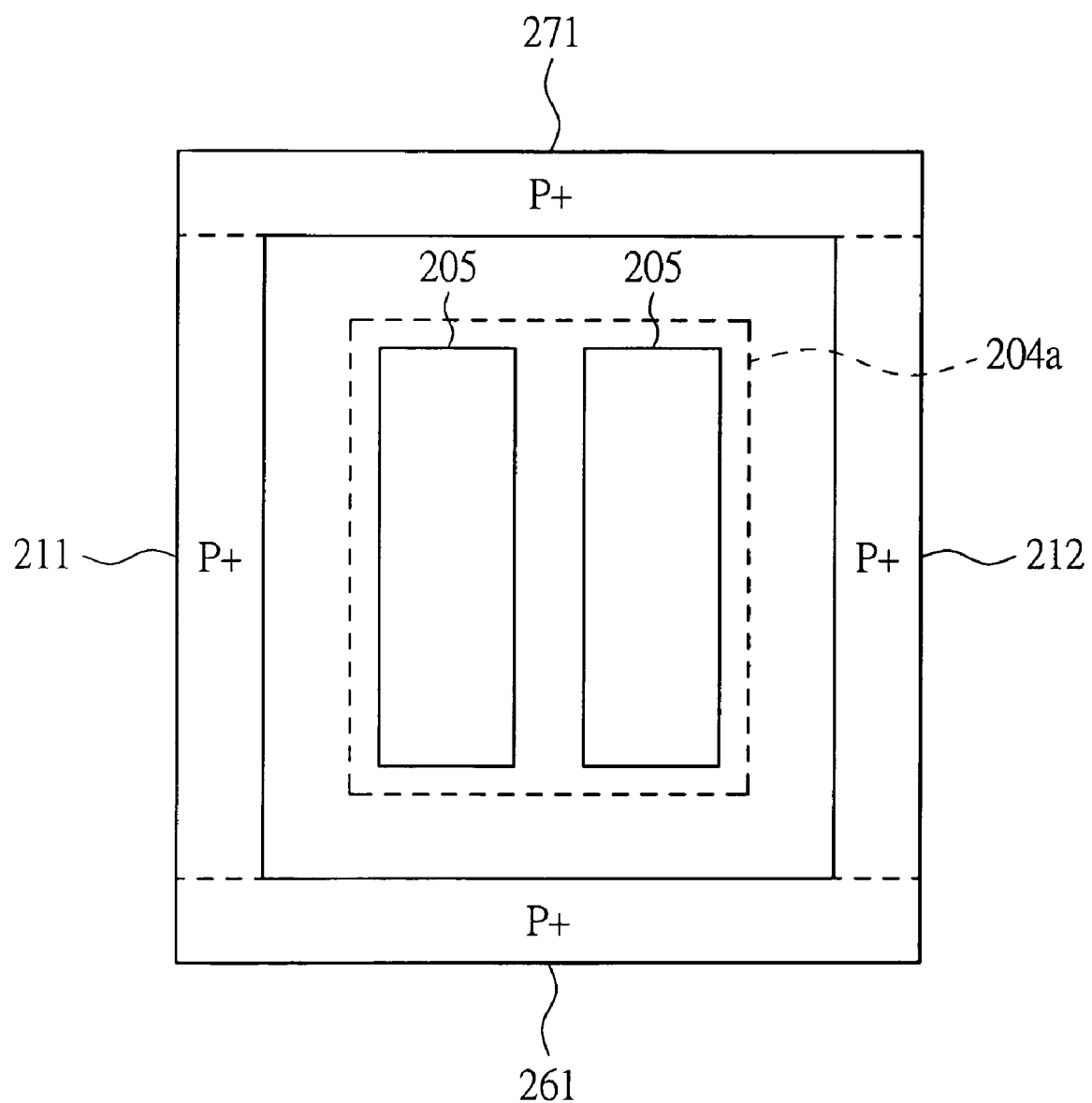
FIG. 5 is a cross-sectional view of the substrate in FIG. 2 along a cutting plane in parallel to the top metal.

Additionally, the shielding structure 210 of the invention is not limited to having only metal walls (metal stacks 220 and 230) disposed on the substrate 202 and located at two sides of the active circuit 204. Referring to FIG. 4 and FIG. 5 at the same time, a three-dimensional (3-D) view of the shielding structure 210 in FIG. 2 and cross-sectional view of the substrate 202 in FIG. 2 along a cutting plane in parallel to the top metal 240 are respectively shown. The shielding structure 210 can further include a third heavy ion-doped region 261, such as a P+ diffusion region, formed in the substrate 202 and located at a third side, such as the front side, of the active circuit 204 (a region 204a for forming the active circuit 204 is defined in the substrate 202, which contains the contact diffusion regions 205) as shown in FIG. 5, and a third metal stack 260 formed on the third heavy ion-doped region 213 of the substrate 202 and connected underneath to the top metal 240 as shown in FIG. 4. Further, the shielding structure 210 can include a fourth heavy ion-doped region 271, such as a P+ region, formed in the substrate 202 and located at a fourth side, such as a rear side, of the active circuit 204 as shown in FIG. 5, and a fourth metal stack (not shown in the figure) formed on the fourth heavy ion-doped region 271 of the substrate 202 and connected underneath to the top metal 240. The metal walls of the shielding structure 210 are electrically isolated from the active circuit 204 by dielectric layers 250.

As a whole, as shown in FIG. 4, the first metal stack 220 (located at the left side), the second metal stack (231a and 231b), the third metal stack 260, the four metal stack (located at the rear side) and the top metal 240 form a rectangular housing on the substrate 202 covering the active circuit 204 (not shown in the figure). Besides, as shown in FIG. 5, the first heavy ion-doped region 211, the second heavy ion-doped region 212, the third heavy ion-doped region 261 and the fourth ion-doped region 271 are connected together to form a rectangular shell in the substrate 202. It is noted that the ion-doped regions 214, 216, 218 and 219 are not shown in FIG. 5.

Although the shielding structure 210 is exemplified to have a 3-D rectangular structure including the first metal stack 220, the second metal stack 230, the third metal stack 260 and the fourth metal stack (totally four metal walls) incorporated with the heavy ion-doped regions 211, 212, 261 and 271 in the embodiment, the shielding structure 210 of the invention can also have a 3-D structure with any other shape, such as a circular shape, and can have only three metal walls, such as the metal stacks 220, 230 and 260 incorporated with the heavy ion-doped regions 211, 212 and 261, or only two metal walls, such as the metal stacks 220 and 230 incorporated with the heavy ion-doped regions 211 and 212. As long as the shielding structure can have at least two metal walls incorporated with two heavy ion-doped regions in the substrate at two sides of the active circuit, all the alternatives are not apart from the scope of the invention.

Figure 6:
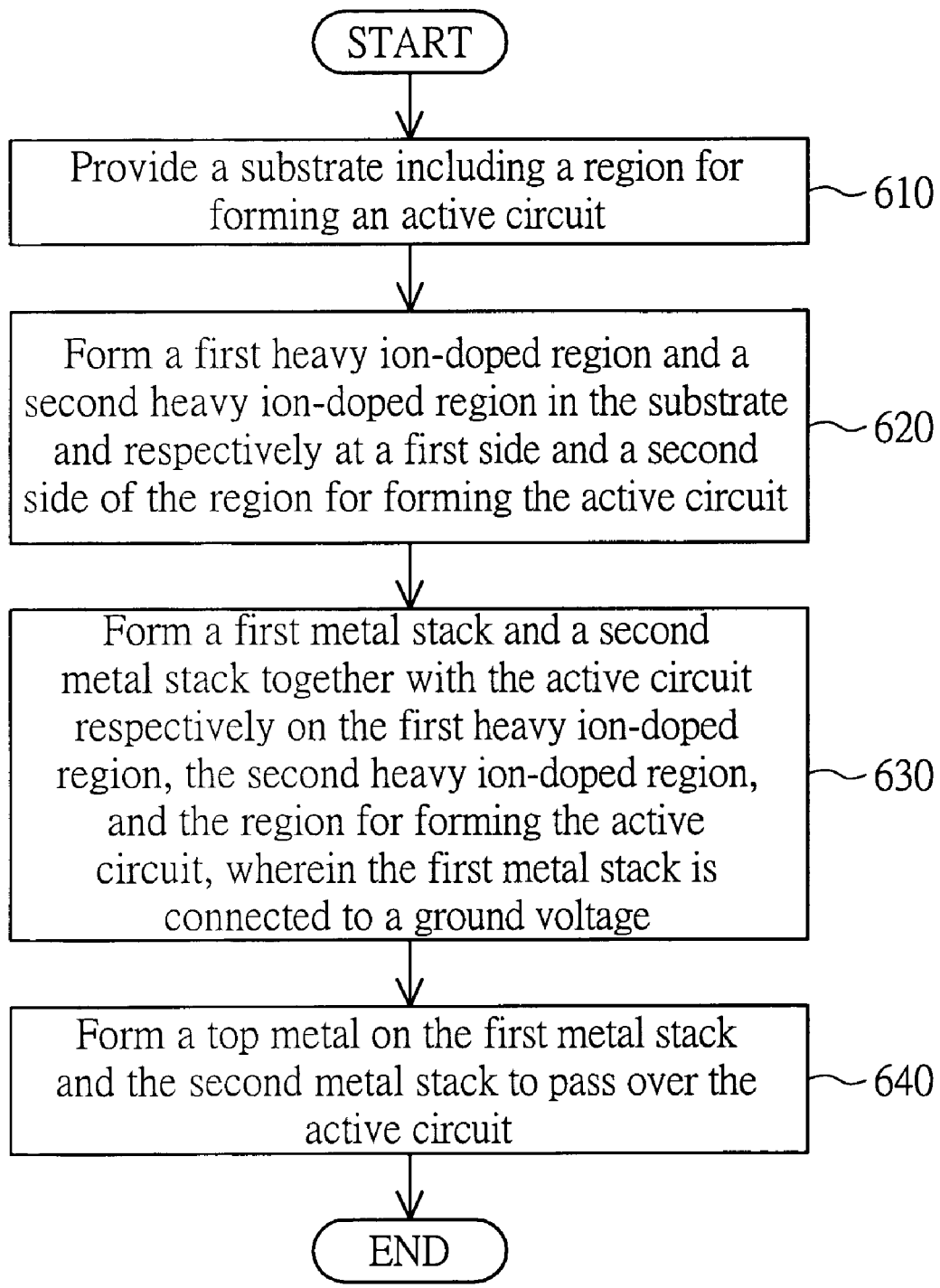
FIG. 6 is a flow chart of a method of manufacturing the electronic device according to the preferred embodiment of the invention.

Referring to FIG. 6, a flow chart of a method of manufacturing the electronic device 200 according to the preferred embodiment of the invention is shown. First, in step 610, provide a substrate including a region for forming an active circuit. For example, provide the P-type substrate 202 to include the region 204a for forming the active circuit 204 as shown in FIG. 5. Following that, in step 620, form a first heavy ion-doped region and a second heavy ion-doped region in the substrate and respectively at a first side and a second side of the region for forming the active circuit. For example, respectively form the first heavy ion-doped (P+) region 211 and the second heavy ion-doped (P+) region 212 in the substrate 202 and located at the left side and the right side of the region 204a as shown in FIG. 5.

It is noted that the active circuit 204 may include no contact diffusion region in the substrate 202, such as a conducting line. However, if the active circuit 204 includes contact diffusion regions, such as the regions 205, the contact diffusion regions 205 are formed together with the heavy ion-doped regions 211 and 212 in the step 620. Besides, the heavy ion-doped region 214 and deep ion-doped region 218 can be further formed in the substrate 202 and located at the left side of the active circuit 204 and the heavy ion-doped region 216 and deep ion-doped region 219 can be further formed in the substrate 202 and located at the right side of the active circuit 204 as shown in FIG. 2 in order to increase the shielding effect of the shielding structure 210 for shielding the active circuit 204 from crosstalk or interference through the substrate 202.

Next, in step 630, form a first metal stack and a second metal stack together with the active circuit respectively on the first heavy ion-doped region, the second heavy ion-doped region, and the region for forming the active circuit, wherein the first metal stack is connected to a ground voltage.

For example, the active circuit 204 includes N semiconductor layers, which may include metal layers and dielectric layers, N is a natural number, and N is 9 in the active circuit 204 of FIG. 2. In step 630, sequentially form the N layers of first metal 221 of the first metal stack 220 on the first heavy ion-doped region 211, the N layers of second metal 231 of the second metal stack 230 on the second heavy ion-doped region 212, and the N semiconductor layers of the active circuit 204 on the substrate 202. The first metal 221 and the second metal 231 formed corresponding to a metal layer of the active circuit 204 are metal layers 221b and 231b, and the first metal 221 and the second metal 231 formed corresponding to a dielectric layer of the active circuit 204 are via (or contact) metals 221a and 231a as shown in FIG. 2. Then, sequentially form m (m=2) dielectric layers 250 on the N semiconductor layers of the active circuit 204, and form m layers of first metal 221 and second metal 231 respectively on the N layers of first metal 221 and second metal 231 as shown in FIG. 2, wherein m is an even number.

It is noted that in the embodiment where the first deep ion-doped region 218 and the fourth heavy ion-doped region 214 are formed adjacent to the first heavy ion-doped region 211 and the second deep ion-doped region 219 and the sixth heavy ion-doped region 216 are formed adjacent to the second heavy ion-doped region 212 (in the step 620), the first metal stack 220 is formed on the first heavy ion-doped region 211, the first deep ion-doped region 218 and the fourth heavy ion-doped region 214, and the second metal stack 230 is formed on the second heavy ion-doped region 212, the second deep ion-doped region 219 and the sixth heavy ion-doped region 216 in the step 630.

Finally, in step 640, form a top metal on the first metal stack and the second metal stack to pass over the active circuit. For example, form the top metal 240 on the first metal stack 220 and the second metal stack 230 to pass over the active circuit 204. In another embodiment, the third heavy ion-doped region 261 and the fourth heavy ion-doped region 271 can be further formed in the substrate 202 together with the heavy ion-doped regions 211 and 212 to form a rectangular shell as shown in FIG. 5 in the step 620, and the third metal stack 260 and the fourth metal stack can be further respectively formed on the third heavy ion-doped region 261 and the fourth ion-doped region 271 to form a rectangular housing covering the active circuit 204 as shown in FIG. 4. Moreover, the thickness of the top metal (e.g. 240) is about twice the thickness of the first metal (e.g. 221) and the second metal (e.g. 231) in order to provide enough shielding effect for shielding the active circuit 204 from the crosstalk or interference through the top metal 240.

In the method of manufacturing the electronic device 200 of the embodiment, the shielding structure 210 is formed by using the available multiple metal layers in the process of fabricating the active circuit 204 (in step 630), and thus the signal integrity can be achieved meanwhile the on-chip crosstalk and interferences can be minimized.

Although the shielding structure 210 of the electronic device 200 is exemplified to be implemented in a CMOS process in the embodiment, the shielding structure 210 of the invention can also be implemented in a bipolar transistor process, a BiCMOS process or even a compound semiconductor process. As long as the shielding structure includes at least two heavy ion-doped regions in the substrate at two sides of the active circuit, at least two metal stacks formed on the two heavy ion-doped regions, and a top metal formed on the two metal stacks covering the active circuit to achieve the purpose of shielding the active circuit from crosstalk or interferences, all the alternatives are not apart from the scope of the invention.

The electronic device with shielding structure and method of manufacturing the same have the following advantages:

(1) By manufacturing a shielding structure for shielding the active circuit, any active circuit including a noisy source, such as a high-speed logic or power amplifier and a critical circuit to be protected can be effectively shielded from crosstalk, noise or interferences. Therefore, the issues of signal contamination by harmonics and linearity degradation of the active circuit in prior art can be effectively resolved.

(2) The shielding technique of the invention utilizing the available multiple metal layers in the fabrication process of the active circuit (e.g. an IC). Therefore, not only the on-chip crosstalk and interferences can be minimized but also the signal integrity can be achieved.

(3) By using the shielding technique of the invention, the on-chip RF isolation can be achieved without additional cost.

(4) The shielding structure of the invention is especially valuable in the implementation of SOC integration, and by using the shielding structure, the communication systems such as GSM, CDMA, portable digital TV, third-generation or fourth-generation mobile or personal communication systems can be integrated into a SOC with lower power consumption, lower cost and smaller size.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An electronic device, comprising:
   a substrate;
   an active circuit, formed on the substrate; and
   a shielding structure, disposed surrounding the active circuit for shielding the active circuit from crosstalk, noise and interferences, the shielding structure comprising:
   a first heavy ion-doped region, formed in the substrate and located at a first side of the active circuit;
   a first metal stack, formed on the first heavy ion-doped region of the substrate, wherein the first metal stack is connected to a ground voltage;
   a second heavy ion-doped region, formed in the substrate and located at a second side of the active circuit;
   a second metal stack, formed on the second heavy ion-doped region of the substrate; and
   a top metal, formed on the first metal stack and the second metal stack and passing over the active circuit.

2. The electronic device according to claim 1, comprising a radio frequency integrated circuit (RFIC), a mixed-signal integrated circuit, a high-speed digital circuit or a system-on-chip (SOC) integrated circuit.

3. The electronic device according to claim 1, wherein the first metal stack, the second metal stack and the top metal are electrically isolated from the active circuit by dielectric material.

4. The electronic device according to claim 1, further comprising:
   a first deep ion-doped region, formed in the substrate and located under the first metal stack and adjacent to the first heavy ion-doped region, wherein the first deep ion-doped region comprises a third heavy ion-doped region and has an ion-doping polarity opposite to that of the first heavy ion-doped region and the same as that of the third heavy ion-doped region;
   a fourth heavy ion-doped region, formed in the substrate and located adjacent to the first deep ion-doped region, wherein the fourth heavy ion-doped region has an ion-doping polarity the same as that of the first heavy ion-doped region;
   a second deep ion-doped region, formed in the substrate and located under the second metal stack and adjacent to the second heavy ion-doped region, wherein the second deep ion-doped region comprises a fifth heavy ion-doped region and has an ion-doping polarity opposite to that of the second heavy ion-doped region and the same as that of the fifth heavy ion-doped region; and
   a sixth heavy ion-doped region, formed in the substrate and located adjacent to the second deep ion-doped region, wherein the sixth heavy ion-doped region has an ion-doping polarity the same as that of the second heavy ion-doped region.

5. The electronic device according to claim 1, wherein the active circuit has N semiconductor layers, the first metal stack and the second metal stack respectively comprise N layers of first metal and second metal formed corresponding to the N semiconductor layers, and m layers of first metal and second metal formed on the N layers of first metal and second metal corresponding to m dielectric layers formed on the active circuit, N is a natural number and m is an even number.

6. The electronic device according to claim 5, wherein the first metal and the second metal formed corresponding to a dielectric layer of the active circuit are via or contact metals, and the first metal and the second metal formed corresponding to a metal layer of the active circuit are metal layers.

7. The electronic device according to claim 5, wherein the thickness of the top metal is about twice the thickness of the first metal and the second metal.

8. The electronic device according to claim 1, wherein the active circuit is a conducting line consisted of a single metal layer, and the first side and the second side are two opposite sides of the conducting line.

9. The electronic device according to claim 1, wherein the shielding structure further comprises:
a third heavy ion-doped region, formed in the substrate and located at a third side of the active circuit; and
a third metal stack, formed on the third heavy ion-doped region of the substrate and connected underneath to the top metal.

10. The electronic device according to claim 9, wherein the shielding structure further comprises:
a fourth heavy ion-doped region, formed in the substrate and at a fourth side of the active circuit; and
a fourth metal stack, formed on the fourth heavy ion-doped region of the substrate and connected underneath to the top metal.

11. The electronic device according to claim 10, wherein the first metal stack, the second metal stack, the third metal stack, the four metal stack and the top metal form a rectangular housing covering the active circuit, and the first heavy ion-doped region, the second heavy ion-doped region, the third heavy ion-doped region and the fourth ion-doped region are connected together to form a rectangular shell.

12. A method of manufacturing an electronic device, the electronic device comprising an active circuit, the method comprising:
providing a substrate comprising a region for forming the active circuit;
forming a first heavy ion-doped region and a second heavy ion-doped region in the substrate and respectively at a first side and a second side of the region for forming the active circuit;
forming a first metal stack and a second metal stack together with the active circuit respectively on the first heavy ion-doped region, the second heavy ion-doped region, and the region for forming the active circuit, wherein the first metal stack is connected to a ground voltage; and
forming a top metal on the first metal stack and the second metal stack to pass over the active circuit.

13. The method according to claim 12, wherein the active circuit comprises N semiconductor layers, N is a natural number, and the step of forming a first metal stack and a second metal stack together with the active circuit further comprises sequentially forming N layers of first metal on the first heavy ion-doped region, N layers of second metal on the second heavy ion-doped region, and the N semiconductor layers of the active circuit on the substrate, the first metal and the second metal formed corresponding to a metal layer of the active circuit are metal layers, and the first metal and the second metal formed corresponding to a dielectric layer of the active circuit are via or contact metals.

14. The method according to claim 13, wherein the step of forming a first metal stack and a second metal stack together with the active circuit further comprises sequentially forming m dielectric layers on the N semiconductor layers of the active circuit, and forming m layers of first metal and second metal respectively on the N layers of first metal and second metal, m is an even number.

15. The method according to claim 13, wherein the thickness of the top metal is about twice the thickness of the first metal and the second metal.

16. The method according to claim 12, wherein the active circuit is a conducting line with a single metal layer, and the first side and the second side are two opposite sides of the active circuit.

17. The method according to claim 12, wherein the step of forming a first heavy ion-doped region and a second heavy ion-doped region in the substrate further comprises:
forming a first deep ion-doped region in the substrate and adjacent to the first heavy ion-doped region, and forming a third heavy ion-doped region in the first deep ion-doped region, wherein the first deep ion-doped region has an ion-doping polarity opposite to that of the first heavy ion-doped region and the same as that of the third heavy ion-doped region;
forming a fourth heavy ion-doped region in the substrate and adjacent to the first deep ion-doped region, wherein the fourth heavy ion-doped region has an ion-doping polarity the same as that of the first heavy ion-doped region;
forming a second deep ion-doped region in the substrate and adjacent to the second heavy ion-doped region, and forming a fifth heavy ion-doped region in the second deep ion-doped region, wherein the second deep ion-doped region has an ion-doping polarity opposite to that of the second heavy ion-doped region and the same as that of the fifth heavy ion-doped region; and
forming a sixth heavy ion-doped region in the substrate and adjacent to the second deep ion-doped region, wherein the sixth heavy ion-doped region has an ion-doping polarity the same as that of the second heavy ion-doped region; wherein the step of forming a first metal stack and a second metal stack further comprises:
forming the first metal stack on the first heavy ion-doped region, the first deep ion-doped region and the fourth heavy ion-doped region; and
forming the second metal stack on the second heavy ion-doped region, the second deep ion-doped region and the sixth heavy ion-doped region.

18. The method according to claim 17, wherein the electronic device is implemented in a CMOS process, the substrate is a P-type substrate, the first heavy ion-doped region, the second heavy ion-doped region, the fourth heavy ion-doped region, and the sixth heavy ion-doped region are P+ diffusion regions, the first deep ion-doped region and the second deep ion-doped region are deep N− wells, and the third heavy ion-doped region and the fifth heavy ion-doped region are N+ diffusion region.

19. The method according to claim 12, wherein the step of forming a first heavy ion-doped region and a second heavy ion-doped region in the substrate further comprises:
forming a third heavy ion-doped region in the substrate and at a third side of the active circuit;
wherein the step of forming a first metal stack and a second metal stack together with the active circuit further comprises:
forming a third metal stack on the third heavy ion-doped region of the substrate;
wherein the step of forming the top metal comprises forming the top metal on the third metal stack.

20. The method according to claim 19, wherein the step of forming a first heavy ion-doped region and a second heavy ion-doped region in the substrate further comprises:
forming a fourth heavy ion-doped region in the substrate and at a fourth side of the active circuit;
wherein the step of forming a first metal stack and a second metal stack together with the active circuit further comprises:

forming a fourth metal stack on the fourth heavy ion-doped region of the substrate;

wherein the step of forming the top metal comprises forming the top metal on the fourth metal stack.

21. The method according to claim 20, wherein the first metal stack, the second metal stack, the third metal stack, the four metal stack and the top metal form a rectangular housing covering the active circuit, and the first heavy ion-doped region, the second heavy ion-doped region, the third heavy ion-doped region and the fourth ion-doped region are connected together to form a rectangular shell.

* * * * *